(12) United States Patent
Park et al.

(10) Patent No.: US 6,884,678 B2
(45) Date of Patent: Apr. 26, 2005

(54) METHOD FOR FORMING CAPACITOR OF SEMICONDUCTOR DEVICE

(75) Inventors: Dong Su Park, Icheon-si (KR); Tae Hyeok Lee, Icheon-si (KR); Cheol Hwan Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/608,429

(22) Filed: Jun. 30, 2003

(65) Prior Publication Data

US 2004/0110341 A1 Jun. 10, 2004

(30) Foreign Application Priority Data

Dec. 6, 2002 (KR) .................................. 10-2002-0077493

(51) Int. Cl.⁷ ......................................... H01L 21/8242
(52) U.S. Cl. ....................................................... 438/254
(58) Field of Search ................................. 438/254, 397

(56) References Cited

U.S. PATENT DOCUMENTS 6,576,947 B1 * 6/2003 Kim ........................... 257/309
6,656,789 B1 * 12/2003 Lee et al. ..................... 438/253

FOREIGN PATENT DOCUMENTS

KR 2001-0056241 7/2001
KR 2002-0052655 7/2002

* cited by examiner

*Primary Examiner*—David Nelms
*Assistant Examiner*—Quoc Hoang
(74) *Attorney, Agent, or Firm*—Heller Ehrman White and McAuliffe LLP

(57) ABSTRACT

A method for forming of a capacitor wherein an etching barrier layer comprising a stacked structure of a nitride film and a tantalum oxide film is disclosed. The method comprises the steps of: forming an etching barrier layer on an interlayer insulating film having a storage electrode contact plug therein, the etching barrier layer comprising a stacked structure of a nitride film and a tantalum oxide film; forming an oxide film on the etching barrier layer; selectively etching the oxide film and the etching barrier layer to form an opening exposing the storage electrode contact plug; depositing a storage electrode layer on the bottom and the inner walls of the opening; and removing the oxide film, whereby forming a storage electrode.

12 Claims, 5 Drawing Sheets

METHOD FOR FORMING CAPACITOR OF SEMICONDUCTOR DEVICE

BACKGROUND OF THE INVENTION

1. Field of the Invention

The present invention generally relates to a method for forming a capacitor of a semiconductor device, and more specifically, to a method for forming of a capacitor wherein an etching barrier layer comprising a stacked structure of a nitride film and a tantalum oxide film is employed to prevent cracking and to provide sufficient support for storage electrode.

2. Description of the Prior Art

As the size of a cell decreases due to a high integration density of a semiconductor device, it becomes more difficult to obtain sufficient capacitance which is proportional to a surface area of a storage node.

In particular, in the DRAM wherein a unit cell includes a MOS transistor and a capacitor, a capacitance of the capacitor needs to be increased and an area occupied by the capacitor needs to be decreased to achieve high integration.

In order to increase capacitance C of a capacitor which follows the equation of $(\epsilon_0 \times \epsilon_r \times A)/T$ ($\epsilon_0$: vacuum dielectric constant, $\epsilon_r$: dielectric constant of dielectric film, A: area of storage electrode, T: thickness of dielectric film), there are proposed methods of using a dielectric film having a high dielectric constant, of reducing the thickness of the dielectric film, or of increasing a surface area of a storage electrode.

A conventional method for forming a concave-type (or cylinder-type) capacitor (not shown) is as follows.

A device isolation film, an impurity junction region, a word line, a bit line and a contact plug for storage electrode are formed on a semiconductor substrate. Then, an interlayer insulating film is formed on the resulting structure.

A nitride film having a thickness of less than 1000 Å, which is an etching barrier layer, is formed on the resulting structure.

An oxide film for storage electrode is formed on the nitride film. The oxide film has a thickness of more than 15000 Å and consists of BPSG, PSG or TEOS.

Thereafter, the oxide film for storage electrode is etched via a photolithogrphy process using a storage electrode mask to form a storage electrode region exposing the storage electrode contact plug.

A conductive layer for storage electrode connected to the storage electrode contact plug is formed on the entire surface of resulting structure including the storage electrode region.

Next, a photoresist film filling the storage electrode region is formed on the entire surface of the resulting structure, and then planarized to expose the oxide film for storage electrode.

Thereafter, the photoresist film is removed so that only a portion of the conductive layer for storage electrode on the surface of the storage electrode region remains. The oxide film for storage electrode is then removed to form a concave-type storage electrode. The process of removing the oxide film for storage electrode is performed using BOE solution. The nitride film, which serves as an etching barrier layer, is damaged during the process.

A dielectric film is formed on the surface of the storage electrode, and an annealing process then is performed. The annealing process is performed under an oxygen atmosphere at a temperature higher than 700° C. During the annealing process, cracks are generated in the damaged nitride film, and thus the nitride film cannot support the storage electrode. As a result, the storage electrode collapses, which leads to bridging between adjacent storage electrodes. Moreover, oxygen atoms penetrate through the cracks to oxidize a lower bit line.

A plate electrode is then formed to complete the formation of a capacitor.

FIG. 1a is a photograph showing a cross-section of a conventional capacitor of a semiconductor device wherein the lower bit line is oxidized by the oxygen atoms.

FIG. 1b is a plane view illustrating the structure of the conventional capacitor shown in FIG. 1a.

FIG. 2 is a photograph showing a plane view of the conventional capacitor of a semiconductor device wherein bridging between adjacent storage electrodes due to lack of support by the etching barrier layer are shown.

As described above, according to the conventional method for forming a capacitor device, the nitride film serving as an etching barrier layer is damaged in the process of removing the oxide film for storage electrode. This damage causes bridging between adjacent storage electrodes. Moreover, cracks in the etching barrier layer generated during the annealing process causes oxidation of lower conductive layers due to oxygen atoms penetrating through the crack.

As a result, characteristics and reliability of semiconductor device are degraded, and high integration of the semiconductor device cannot be achieved.

SUMMARY OF THE INVENTION

It is object of the present invention to provide a method for forming a capacitor of a semiconductor device wherein an etching barrier layer having a stacked structure of a nitride film and a tantalum oxide film is formed to prevent penetration of oxygen, thereby inhibiting oxidation of an electrode, and to relieve the stress of the nitride film, thereby preventing a crack.

The method for forming a capacitor of a semiconductor device, comprising the steps of: forming an etching barrier layer on an interlayer insulating film having a storage electrode contact plug therein, the etching barrier layer comprising a stacked structure of a nitride film and a tantalum oxide film; forming an oxide film on the etching barrier layer; selectively etching the oxide film and the etching barrier layer to form an opening exposing the storage electrode contact plug; depositing a storage electrode layer on the bottom and the inner walls of the opening; and removing the oxide film, whereby forming a storage electrode is provided.

BRIEF DESCRIPTION OF THE DRAWINGS

FIG. 1b is a plane view illustrating the structure of the conventional capacitor shown in FIG. 1a.

DETAILED DESCRIPTION OF THE PREFERRED EMBODIMENTS

The present invention will be described in detail with reference to the accompanying drawings.

Figure 1A:
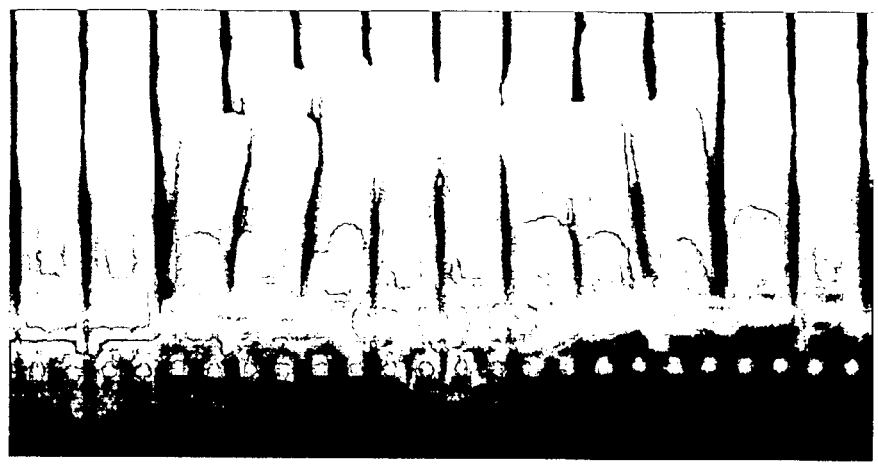
FIG. 1a is a photograph showing a cross-section of a conventional capacitor of a semiconductor device.
Figure 1B:
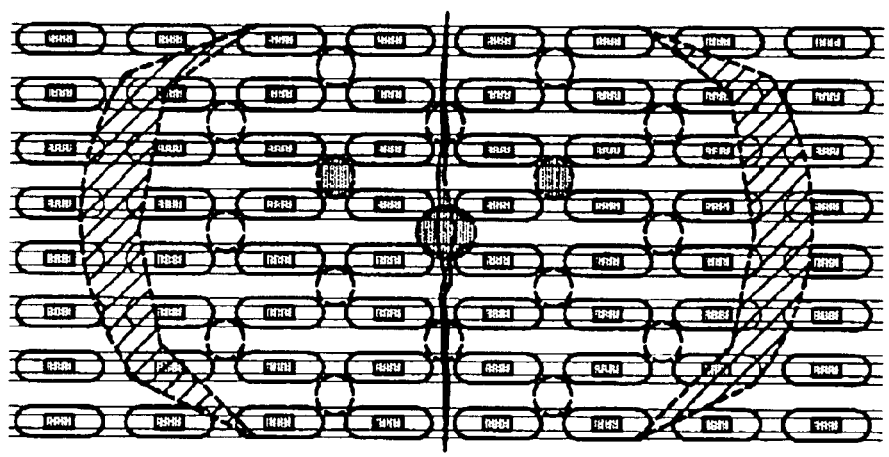
Figure 2:
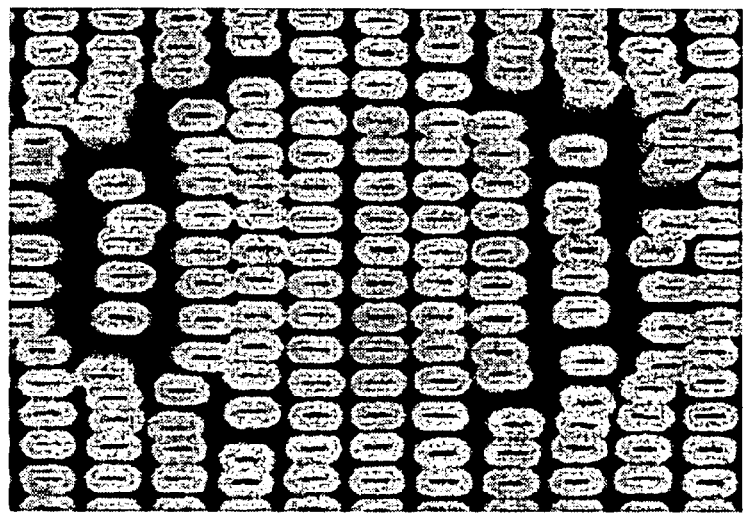
FIG. 2 is a photograph showing a plane view of the conventional capacitor of a semiconductor device.
Figure 3A:
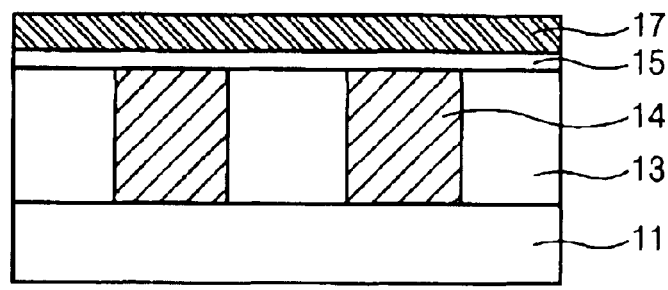
FIGS. 3a through 3c are cross-sectional diagrams illustrating a method for forming a capacitor of a semiconductor device according to a preferred embodiment of the present invention.
Figure 3B:
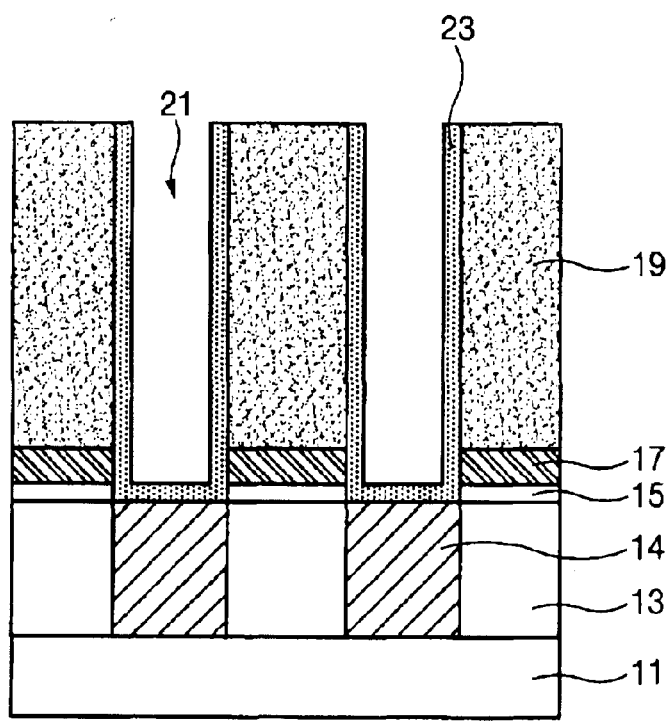
Figure 3C:
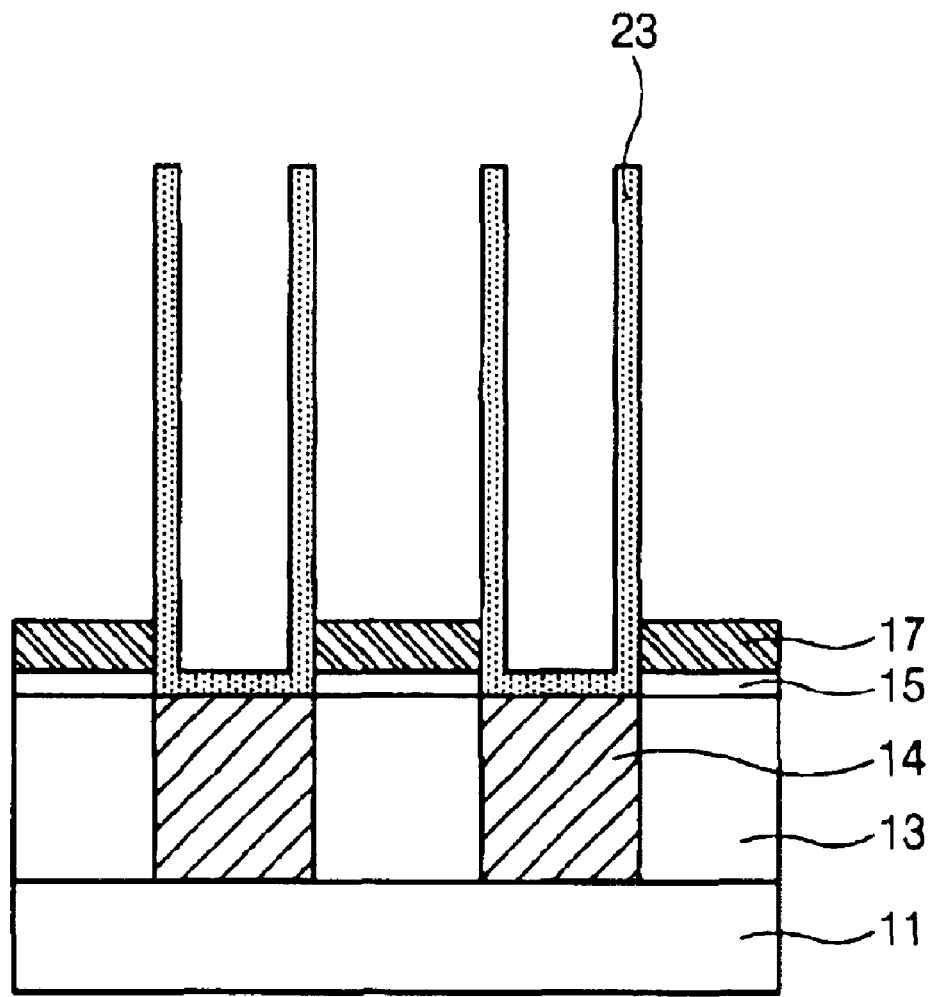

FIGS. 3a through 3c are cross-sectional diagrams illustrating a method for forming a capacitor of a semiconductor device according to a preferred embodiment of the present invention.

Referring to FIG. 3a, a device isolation film (not shown), an impurity junction region (not shown), a word line (not shown) and a bit line (not shown) is formed on a semiconductor substrate 11. An interlayer insulating film 14 including a contact plug 13 for storage electrode is then formed on the semiconductor substrate 11. Thereafter, an etching barrier layer consisting of a stacked structure of a nitride film 15 and a tantalum oxide film 17 is formed on the entire surface of the resulting structure.

The nitride film 15 is preferably formed via a LPCVD or a PECVD method. The LPCVD process is performed in a furnace at a temperature ranging from 600 to 800° C. using DCS and $NH_3$ or in a single chamber at a temperature ranging from 550 to 800° C. using $NH_3$ and a gas selected from the group consisting of $SiH_4$, $Si_2H_6$ and combinations thereof. The PECVD process is performed by exciting plasma at a temperature of lower than 600° C. under an atmosphere of a mixture gas of a gas selected from the group consisting of $SiH_4$, $Si_2H_6$ and combinations thereof, and a gas selected from the group consisting of $NH_3$, $N_2$ and combinations thereof.

The tantalum oxide film 17 is preferably in amorphous state and the detail of the formation process thereof is as follows.

A chemical such as $Ta(OC_2H_5)_5$ is supplied to an evaporator via a flow rate controller such as an LMFC (liquid mass flow controller) and then evaporated at a temperature ranging from 120 to 200° C. to form a chemical vapor containing Ta. Since the evaporation temperature of $Ta(OC_2H_5)_5$ is higher than 110° C., the evaporation process should be performed at a temperature higher than 110° C.

Thereafter, the chemical vapor containing Ta and excessive oxygen gas which is a reaction gas is supplied to a LPCVD chamber at a flow rate ranging from 10 to 1000 sccm and at a temperature ranging from 300 to 600° C. to induce surface reaction, thereby forming the tantalum oxide film 17 in amorphous state.

In one embodiment, the tantalum oxide film 17 may be formed using only $Ta(OC_2H_5)_5$ source, or TaON may be used instead of the tantalum oxide film using a Ta source and a $NH_3$ source gas as reaction gases.

In another embodiment, the nitride film 15 and the tantalum oxide film 17 may be formed in one system such as (a) or (b).

(a) a tantalum oxide film deposition chamber and a nitride film deposition chamber are configured to constitute a multi-chamber in one system. PECVD or LPCVD methods are preferred.

(b) The nitride film 15 and the tantalum oxide film 17 are formed in the same chamber. In this case, the nitride film 15 is first deposited via a PECVD process using a gas selected from the group consisting of $SiH_4$, $Si_2H_6$ and combinations thereof in a tantalum oxide film deposition chamber and adding an $NH_3$ line thereto, and then the tantalum oxide film 17 is deposited after a purge process.

Since the tantalum oxide film deposition chamber is maintained at a low temperature, and a plasma can be excited therein, a film is not deposited easily via a LPCVD process. However, since only PECVD process is used to form the nitride film 15, the nitride film 15 and the tantalum oxide film 17 can be formed in the tantalum oxide film deposition chamber having a low temperature.

Referring to FIGS. 3b and 3c, an oxide film 19 for storage electrode is formed on the tantalum oxide film 17. Preferably, the oxide film 19 has a thickness of more than 15000 Å, and consists of oxide films containing impurities such as BPSG, PSG or TEOS.

Thereafter, the oxide film 19 is selectively etched via a photolithography process using a storage electrode mask to form an opening 21 exposing the storage electrode contact plug 13. A conductive layer (not shown) for storage electrode is formed on the entire surface of the resulting structure including the surface of the opening 21. A photoresist film (not shown) filling the opening 21 is then formed on the entire surface of the resulting structure.

Next, the entire surface is planarized to expose the oxide film 19 for storage electrode. Thereafter, the photoresist film and the oxide film 19 for storage electrode are removed to form a concave-type storage electrode 23. The process of removing the oxide film 19 for storage electrode is preferably a etching process using BOE solution.

Thereafter, a dielectric film (not shown) is formed on the surface of the storage electrode 23, and then subjected to an annealing process. The annealing process is preferably performed under an oxygen atmosphere at a temperature higher than 700° C. A plate electrode (not shown) is formed on the dielectric film to complete the formation of a capacitor.

Figure 4:
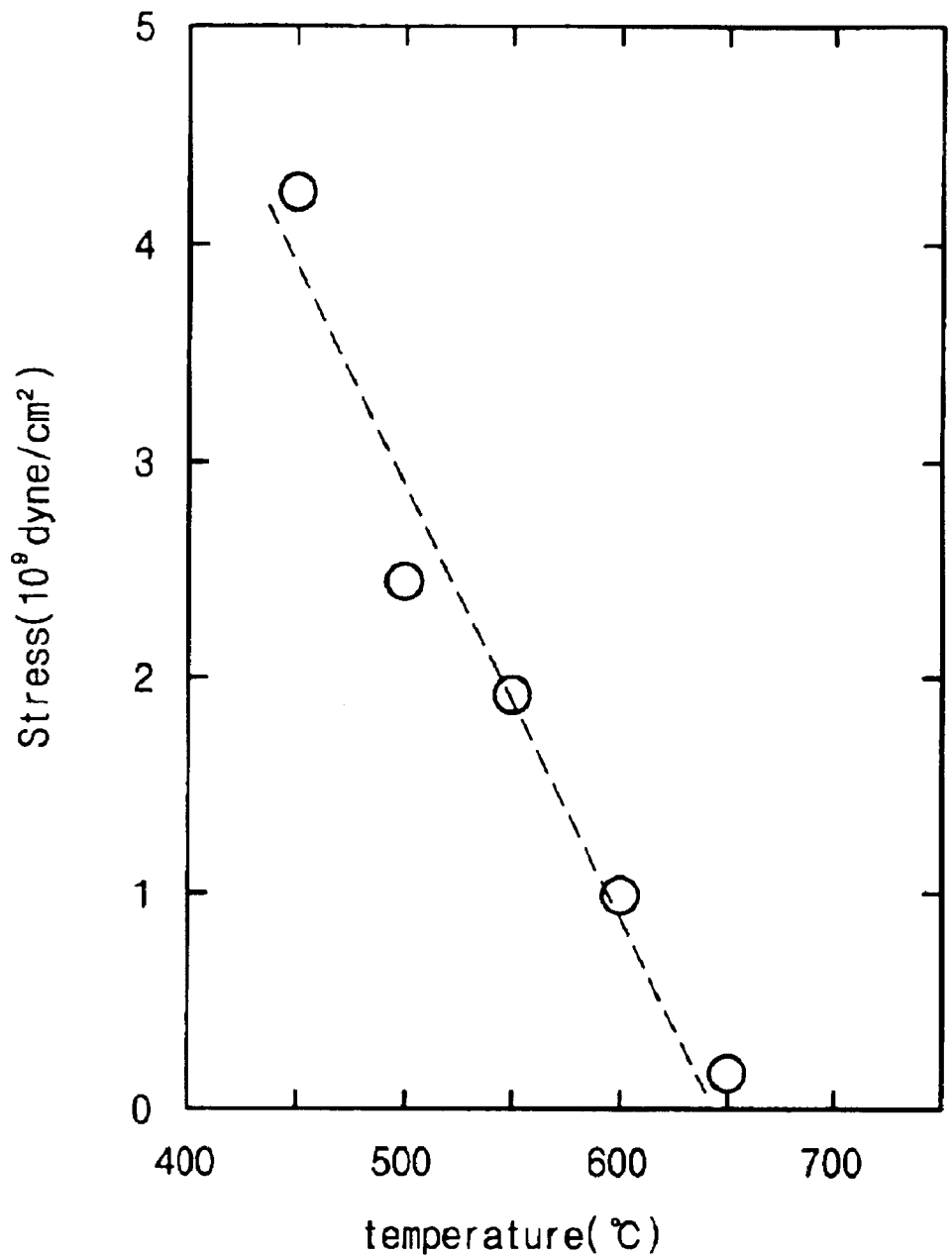
FIG. 4 is a graph showing the stress of a tantalum oxide film according to the temperature in a thermal treatment process.

FIG. 4 is a graph showing the stress of a tantalum oxide film according to the temperature of an annealing process. It should be noted that the stress decreases as the temperature is increased.

As discussed earlier, according to the method for forming a capacitor of a semiconductor device of the present invention, an etching barrier layer having a stacked structure of a nitride film and a tantalum is formed to prevent damage of the nitride film and collapse of a storage electrode, thereby providing a capacitor having sufficient capacitance for high integration of a semiconductor device.

What is claimed is:

1. A method for forming a capacitor of a semiconductor device, comprising the steps of:
   forming an etching barrier layer on an interlayer insulating film having a storage electrode contact plug therein, the etching barrier layer comprising a stacked structure of a nitride film and a tantalum oxide film;
   forming an oxide film on the etching barrier layer;
   selectively etching the oxide film and the etching barrier layer to form an opening exposing the storage electrode contact plug;
   depositing a storage electrode layer on the bottom and the inner walls of the opening; and
   removing the oxide film, whereby forming a storage electrode.

2. The method according to claim 1, wherein the nitride film is formed in a LPCVD or a PECVD process.

3. The method according to claim 2, wherein the LPCVD process is performed at a temperature ranging from 600 to 800° C. using DCS and $NH_3$.

4. The method according to claim 2, wherein the LPCVD process is performed in a single chamber at a temperature ranging from 550 to 800° C. using $NH_3$ and a gas selected from the group consisting of $SiH_4$, $Si_2H_6$ and combinations thereof.

5. The method according to claim 2, wherein the PECVD process is performed by exciting plasma at a temperature lower than 600° C. under an atmosphere of a mixture gas of (i) a gas selected from the group consisting of $SiH_4$, $Si_2H_6$ and combinations thereof, and (ii) a gas selected from the group consisting of $NH_3$, $N_2$ and combinations thereof.

6. The method according to claim 1, wherein the formation process of the tantalum oxide film comprises: (i) providing $Ta(OC_2H_5)_5$ as a source gas to an evaporator, (ii) evaporating the $Ta(OC_2H_5)_5$ at a temperature ranging from 120 to 200° C. to create a Ta chemical vapor, and (iii) supplying the Ta chemical vapor and an oxygen gas as a reactive gas to a LPCVD chamber at amount of 10~1000 sccm, respectively to be subject to surface reaction at a temperature ranging from 300 to 600° C. to induce surface reaction.

7. The method according to claim 1, wherein the tantalum oxide film is formed in a LPCVD chamber using $Ta(OC_2H_5)_5$ as a source.

8. The method according to claim 1, wherein the etching barrier layer is formed by in-situ process in a multi-chamber having a tantalum oxide film chamber and a nitride film chamber.

9. The method according to claim 8, wherein the in-situ process is a PECVD or a LPCVD process.

10. The method according to claim 1, wherein the step of forming the etching barrier layer comprises: (i) depositing a nitride film in a PECVD process using a $NH_3$ gas and a gas selected from the group consisting of $SiH_4$, $Si_2H_6$ and combinations thereof in a tantalum oxide film deposition chamber, and (ii) depositing a tantalum oxide film after a purge process.

11. A method for forming a capacitor of a semiconductor device, comprising the steps of:

forming an etching barrier layer on an interlayer insulating film having a storage electrode contact plug therein, the etching barrier layer comprising a stacked structure of a nitride film and a tantalum oxide nitride (TaON) film;

forming an oxide film on the overall surface of the resultant structure;

selectively etching the oxide film and the etching barrier layer to form an opening exposing the storage electrode contact plug;

forming a storage electrode layer contacting the storage electrode contact plug on the bottom and the inner walls of the opening; and removing the oxide film, whereby forming a storage electrode pattern.

12. The method according to claim 11, wherein the TaON film is formed using a Ta source gas and $NH_3$ source gas.

* * * * *